(12) United States Patent
Hsu et al.

(10) Patent No.: US 8,052,453 B2
(45) Date of Patent: Nov. 8, 2011

(54) LAND GRID ARRAY SOCKET CONNECTOR WITH ANTI-SLIPPERY LOAD LEVER STRUCTURE

(75) Inventors: Shuo-Hsiu Hsu, Tu-Cheng (TW); Nan-Hung Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/849,053

(22) Filed: Aug. 3, 2010

(65) Prior Publication Data
US 2011/0034057 A1  Feb. 10, 2011

(30) Foreign Application Priority Data
Aug. 4, 2009  (TW) .............................. 98214397 U

(51) Int. Cl.
*H01R 13/62* (2006.01)
(52) U.S. Cl. ...................................... 439/331
(58) Field of Classification Search .................. 439/331, 439/330
See application file for complete search history.

(56) References Cited

U.S. PATENT DOCUMENTS

| 5,395,254 | A | * | 3/1995 | Mogi | 439/70 |
|---|---|---|---|---|---|
| 6,004,141 | A | * | 12/1999 | Abe et al. | 439/73 |
| 7,147,483 | B1 | * | 12/2006 | Ju | 439/73 |
| 7,252,517 | B2 | * | 8/2007 | Ju | 439/73 |
| 7,258,563 | B2 | * | 8/2007 | Ju | 439/331 |
| 7,374,446 | B2 | * | 5/2008 | Toda et al. | 439/342 |
| 7,402,065 | B1 | * | 7/2008 | Polnyi | 439/331 |
| 7,794,261 | B2 | * | 9/2010 | Terhune et al. | 439/331 |
| 2005/0020117 | A1 | * | 1/2005 | Motohashi | 439/331 |
| 2005/0287858 | A1 | * | 12/2005 | Toda et al. | 439/331 |
| 2008/0220643 | A1 | * | 9/2008 | Zhang | 439/331 |

FOREIGN PATENT DOCUMENTS
TW   M331235   4/2008
* cited by examiner

*Primary Examiner* — Tulsidas C Patel
*Assistant Examiner* — Vladimir Imas
(74) *Attorney, Agent, or Firm* — Ming Chieh Chang; Wei Te Chung; Andrew C. Cheng

(57) ABSTRACT

A socket connector (100) includes an insulative housing (1), a number of contacts received in the insulative housing, a stiffener (2) attaching to periphery of the insulative housing, a load plate (3) pivotally mounted to one side of the stiffener, a load lever (4) pivotally mounted on the opposite side of the stiffener relative to the load plate, and a sheath piece (5) attached to the operating part of the load lever. The load lever includes a fixing part (41), an actuating part (42) perpendicular to the fixing part, and an operating part (43) formed at the distal end of the actuating part. The load plate is capable of moving towards the insulative housing between an original, open position and a final, closed position.

17 Claims, 2 Drawing Sheets

LAND GRID ARRAY SOCKET CONNECTOR WITH ANTI-SLIPPERY LOAD LEVER STRUCTURE

BACKGROUND OF THE INVENTION

1. Field of the Invention

The present invention relates generally to an Land Grid Array (LGA) socket connector, and more particularly to an LGA socket connector with an improved load lever which is anti-slippery.

2. Description of Related Arts

TW Pat. No. M331235 issued on Apr. 21, 2008 and having the same assignee as the present patent application discloses a traditional LGA socket connector. The LGA socket connector comprises an insulative housing, a plurality of contacts received in the insulative housing, a stiffener attaching to periphery of the insulative housing, a load plate pivotally mounted to one side of the stiffener, and a load lever pivotally mounted on the opposite side of the stiffener. The load plate is arranged at an original, open position when the socket connector is not in use. A CPU (Central Processing Unit) is put onto the insulative housing and a user rotates the load lever to actuate the load plate to move towards the insulative housing, and therefore, the CPU is received between the insulative housing and the load plate for electrically connection with the contacts. When the CPU is assembled, the load plate is at a final, closed, and secured position with respect to the insulative housing. Usually, the load lever is L-shaped and has a fixing part, an actuating part perpendicular to the fixing part and an operating part formed at the distal end of the actuating part and commonly shaping as a "U" figure. The load lever is commonly made of a metallic shaft and the operating part is rather slippery, and therefore, is not friendly operated by the user.

Hence, a socket connector having a friendly using load lever is desired to overcome the aforementioned disadvantage of the prior art.

SUMMARY OF THE INVENTION

Accordingly, an object of the present invention is to provide a socket connector having a load lever which is friendly operated.

To achieve the above object, a socket connector includes an insulative housing, a number of contacts received in the insulative housing, a stiffener attaching to periphery of the insulative housing, a load plate pivotally mounted to one side of the stiffener, a load lever pivotally mounted on the opposite side of the stiffener relative to the load plate, and a sheath piece attached to the operating part of the load lever. The load lever includes a fixing part, an actuating part perpendicular to the fixing part, and an operating part formed at the distal end of the actuating part. The load plate is capable of moving towards the insulative housing between an original, open position and a final, closed position.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
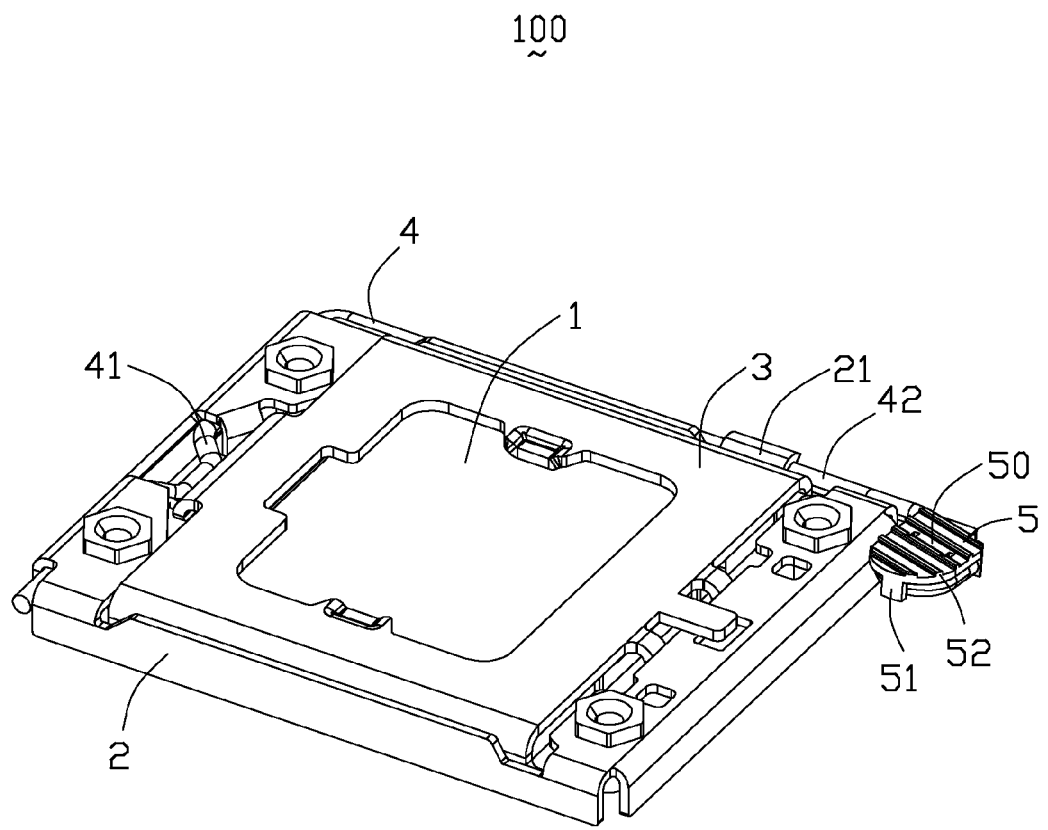
FIG. 1 is a perspective, assembled view of a socket connector constructed in accordance with the present invention.
Figure 2:
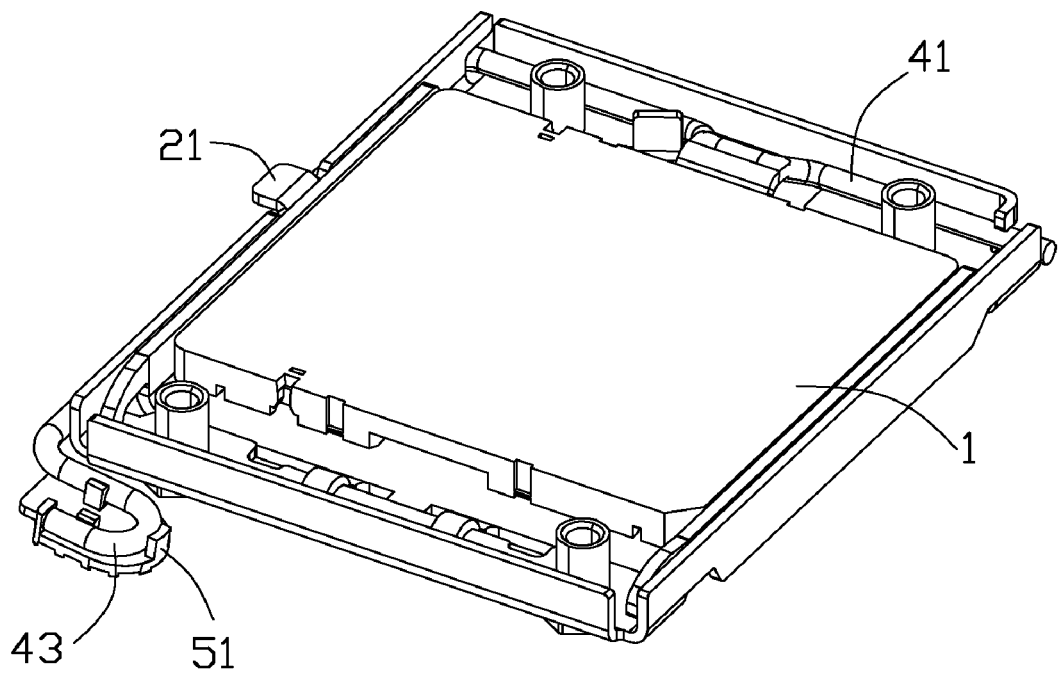
FIG. 2 is another perspective, assembled view of the socket connector.

Referring to FIGS. 1 and 2, a socket connector 100 of the present invention, used for receiving a CPU (Central Processing Unit, not shown), comprises a rectangular insulative housing 1, a plurality of contacts (not shown) received in the insulative housing 1, a metal stiffener 2 attaching to periphery of the insulative housing 1, a metal load plate 3 pivotally mounted to one side of the stiffener 2, and a load lever 4 pivotally mounted on the opposite side of the stiffener 2. The load lever 4 is a L-shaped and comprises a fixing part 41, an actuating part 42 perpendicular to the fixing part 41, and an operating part 43 formed at the distal end of the actuating part 42 and commonly shaping as a "U" figure. In the present invention, the operating part 43 and the fixing part 41 are arranged on two opposite sides of the insulative housing 1, but it is not limiting. In an alternative embodiment, the fixing part 41 is assembled to a rear end of the stiffener 2 while the operating part 43 as well as the actuating part 42 is located at a lateral side of the stiffener 2. The socket connector 100 further comprises a sheath piece 5 attached to the operating part 53 of the load lever 5. The sheath piece 5 is made of rubber, plastic or material like that. The sheath piece 5 comprises a main portion 50 defining an upper surface and a lower surface thereof The main portion 50 forms a plurality of ribs 52 on the upper surface for anti-slippery. The sheath piece 5 further comprises a plurality of latches 51 extending downwardly from the lower edge of the main portion 50 for securing with the operating part 43.

Referring to FIGS. 1 and 2, the load plate 3 is arranged at an original, open position when the socket connector 100 is not in use. A CPU (Central Processing Unit) is put onto the insulative housing 1 and a user rotates the load lever 4 to actuate the load plate 3 to move towards the insulative housing 1, and therefore, the CPU is received between the insulative housing 1 and the load plate 3 for electrically connection with the contacts. When the CPU is assembled, the load plate 3 is at a final, closed, and secured position with respect to the insulative housing 1. The fixing portion 41 of the load lever 4 snaps with the free end of the load plate 3. The stiffener 2 comprises a holding portion 21 extending outwardly from an adjacent edge thereof relative to the actuating part of the load part 1 and accordingly, when the load plate 3 is arranged at the final, closed, and secured position, the load lever 4 is locked by the holding portion 21 of the stiffener 2.

In the present invention, because the sheath piece 5 is attached to the operating part 43, it increases a area for finger and accordingly, it facilitates the operation of the user. Moreover, the sheath piece 5 forms a plurality of ribs 52 for interference and it prevents slipping when the user operates the load lever 5.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A socket connector comprising:
an insulative housing;
a plurality of contacts received in the insulative housing;

a stiffener attaching to periphery of the insulative housing;

a load plate pivotally mounted to one side of the stiffener and capable of moving towards the insulative housing between an original, open position and a final, closed position;

a load lever pivotally mounted on the opposite side of the stiffener relative to the load plate, the load lever comprising a fixing part, an actuating part perpendicular to the fixing part, and an operating part formed at the distal end of the actuating part; and a sheath piece attached to the operating part of the load lever; wherein the sheath piece forms a main portion and a plurality of latches extending downwardly from the lower edge of the main portion, and the latches lock with the operating part.

2. The socket connector as claimed in claim 1, wherein the main portion forms a plurality of ribs.

3. The socket connector as claimed in claim 1, wherein the sheath shapes a "U" figure.

4. The socket connector as claimed in claim 1, wherein the sheath is made of rubber material.

5. The socket connector as claimed in claim 1, wherein the sheath is made of plastic material.

6. The socket connector as claimed in claim 1, wherein the operating part and the fixing part are located on the opposite sides of the stiffener.

7. The socket connector as claimed in claim 1, wherein the stiffener comprises a holding portion extending outwardly for the operating part of the load lever.

8. The socket connector as claimed in claim 1, wherein the fixing portion of the load lever snaps with the load plate at the final, closed position.

9. A socket connector comprising:

an insulative housing equipped with a plurality of contacts therein and defining two opposite lengthwise ends in a longitudinal direction;

a metallic stiffener having at least two opposite first and second portions respectively located intimately outside of said two opposite lengthwise ends of the housing;

a metallic load plate pivotally mounted to the first portion of the stiffener with a distal end moveable around the second portion of the stiffener;

a metallic lever pivotally mounted to the second portion with a distal end moveable around the first portion of the stiffener, and defining a fixing part pivotally mounted to the second portion and an actuating part extending in said longitudinal direction by one side of the housing;

the distal end of the load plate downwardly pressed by the fixing part of the lever during use;

an operation part formed at an end of the actuating part and essentially inside the actuating part in a transverse direction perpendicular to said longitudinal direction while exposed outside of the first portion in said longitudinal direction; wherein a sheath piece covering the operation part in a downward direction perpendicular to both said longitudinal direction and said transverse direction under condition that said sheath piece defines an upward face equipped with anti-slip structures for efficiently performing both shielding and operation functions.

10. The socket connector as claimed in claim 9, wherein said sheath piece does not cover a bottom side of the operation part.

11. The socket connector as claimed in claim 9, wherein said sheath piece defines structures only adapted to be assembled to the operation part in said downward direction.

12. The socket connector as claimed in claim 11, wherein the sheath piece is unitarily formed with a plurality of latches to engage the operation part for at least horizontal retention.

13. The socket connector as claimed in claim 12, wherein some of said latch further define hooks thereof for vertical retention.

14. The socket connector as claimed in claim 9, wherein said operation part is of a U-shaped configuration.

15. The socket connector as claimed in claim 14, wherein said U-shaped configuration lies in substantially a horizontal plane.

16. The socket connector as claimed in claim 15, wherein a notch of said U-shaped configuration is directed outwardly in the transverse direction.

17. The socket connector as claimed in claim 9, wherein said stiffener horizontally fully surrounds the housing.

\* \* \* \* \*